United States Patent [19]

Kushi et al.

[11] Patent Number: 4,970,135
[45] Date of Patent: Nov. 13, 1990

[54] FLAME-RETARDANT LIQUID PHOTOSENSITIVE RESIN COMPOSITION

[75] Inventors: Kenji Kushi; Ken-ichi Inukai, both of Hiroshima, Japan

[73] Assignee: Mitsubishi Rayon Co., Ltd., Tokyo, Japan

[21] Appl. No.: 411,745

[22] Filed: Sep. 25, 1989

[30] Foreign Application Priority Data

Sep. 27, 1988 [JP] Japan ................................ 63-239657

[51] Int. Cl.$^5$ ...................... G03F 7/029; G03F 7/028
[52] U.S. Cl. .................................... 430/280; 430/285; 430/281; 430/286; 522/81; 522/100; 522/103
[58] Field of Search ............... 430/285, 280, 286, 281; 522/100, 103, 81

[56] References Cited

U.S. PATENT DOCUMENTS 4,278,752  7/1981  Gervay et al. ...................... 430/281
4,789,620 12/1988  Sasaki et al. ........................ 430/280

FOREIGN PATENT DOCUMENTS 0259812  3/1988  European Pat. Off. ............ 430/286

*Primary Examiner*—Cynthia Hamilton
*Attorney, Agent, or Firm*—Cushman, Darby & Cushman

[57] ABSTRACT

Disclosed is a flame-retardant liquid photosensitive resin composition consisting essentially of (a) a (meth)acrylate obtained by the reaction of a compound having two or more epoxy groups in the molecule with (meth)acrylic acid and a dibasic acid or its anhydride, the (meth)acrylate having an average acid value of 4 to 150 and a number average molecular weight of 300 to 5,000;

(b) a monomer having at least one (meth)acryloxyloxy group and containing not less than 20% by weight of bromine;

(c) a monomer having two or more (meth)acryloxyloxy groups in the molecule;

(d) a monomer having one (meth)acryloyloxy group in the molecule;

(e) at least one inorganic filler; and (f) at least one photopolymerization catalyst selected from the group consisting of photo-initiators and photosensitizers, wherein the content of bromine in the total composition is in the range of 0.5 to 28% by weight.

This flame-retardant liquid photosensitive resin composition has excellent homogeneity and alkali developability, yields a cured coating film having good adhesion, solvent resistance, thermal resistance, electrical insulating properties and flame retardancy, and is suitable for use as a solder resist in the fabrication of printed circuit boards.

8 Claims, No Drawings

FLAME-RETARDANT LIQUID PHOTOSENSITIVE RESIN COMPOSITION

BACKGROUND OF THE INVENTION (1) Field of the Invention

This invention relates to flame-retardant liquid photosensitive resin compositions which have pattern-forming properties and can be used as solder resists (or solder masks) in the fabrication of printed circuit boards.

(2) Description of the Prior Art

Conventionally, a solder resist (or solder mask) is widely used in the fabrication of printed circuit boards in order to form a permanent protective coating for printed circuit boards. Such a solder resist is used for the purpose of preventing the formation of a solder bridge during soldering and of ensuring the protection of the conductive parts against corrosion and the retention of their electrical insulation during use. Solder resists used under severe conditions, unlike etching resists, must have the following performance characteristics:

(a) Retention of adhesion during soaking in solder (at 240° to 280° C.).
(b) Permanent retention of adhesion.
(c) Excellent resistance to solvents and chemicals.
(d) Retention of good electrical insulating properties under high-humidity conditions.
(e) Flame retardance.

In order to meet these requirements, it has been conventional and common practice to form a solder resist by screen printing of a thermosetting ink or a photocurable ink. However, the increasing miniaturization of printed circuits has created a demand for solder resists having large coating thickness and high precision, and it is the existing state of the art that the screen printing method for the formation of a solder resist is no longer satisfactory from the viewpoint of precision and coating thickness.

The formation of solder resists by the development technique has been proposed as a means for responding to this miniaturization or printed circuits. According to the development technique, a pattern is formed by applying a liquid photosensitive resin composition, or laminating a photosensitive film, to a printed circuit board, exposing the coating film to active radiation through, for example, a photomask to cure only desired portions thereof, and then washing the coating film with a developer to remove any uncured portions thereof. This technique makes it possible to form a solder resist pattern having large coating thickness and high precision.

According to the manner in which the coating film to be cured is formed, solder resists for use in the development technique can be classified into three types: dry film type, solvent evaporation type and solventless liquid type (see Japanese Patent Laid-Open Nos. 52703/'77 and 15733/'76). Among them, solder resists of the dry film type have the disadvantage that, in order to cause the solder resist to adhere closely to an uneven surface having a circuit formed thereon, a special process such as heat lamination under reduced pressure is required (see Japanese Patent Laid-Open No. 52703/'77) and that, notwithstanding the use of such a process, perfect adhesion is not always ensured. In contrast, solder resists of the solvent evaporation type can exhibit good adhesion to an uneven surface having a circuit formed thereon. However, they have the disadvantage that, after the application of a liquid photosensitive resin composition, the resulting coating film must be dried in an explosion-proof dryer or similar equipment so as to evaporate the solvent. Accordingly, there is a great need to develop an improved photosensitive resin composition of the solventless liquid type for use as a solder resist.

On the other hand, liquid photosensitive resin compositions can also be classified according to the type of developer used. That is, they include ones using an organic solvent such as 1,1,1-trichloroethane and ones using a dilute aqueous alkaline solution. Since the use of an organic solvent involves problems concerning the pollution of the working environment and the disposal of waste liquid, development with a dilute aqueous alkaline solution is highly desirable. It is known that these problems can be solved by use of compositions containing a carboxyl-modified epoxy (meth)acrylate as an alkali developability imparting agent (see Japanese Patent Laid-Open Nos. 204252/'87, 204253/'87 and 205113/87). However, these compositions do not have a sufficient degree of flame retardancy.

SUMMARY OF THE INVENTION

It is an object of the present invention to provide a flame-retardant liquid photosensitive resin composition having excellent homogeneity and alkali developability, yielding a cured coating film having good adhesion, solvent resistance, thermal resistance and electrical insulating properties, and exhibiting excellent flame retardancy.

It is another object of the present invention to provide a flame-retardant liquid photosensitive resin composition having excellent performance, especially when used as a solder resist in the fabrication of printed circuit boards.

According to the present invention, there is provided a flame-retardant liquid photosensitive resin composition consisting essentially of (a) 10 to 55% by weight of a (meth)acrylate obtained by the reaction of a compound having two or more epoxy groups in the molecule with (meth)acrylic acid and a dibasic acid or its anhydride, the (meth)acrylate having an average acid value of 4 to 150 and a number average molecular weight of 300 to 5,000;

(b) 3 to 35% by weight of a monomer having at least one (meth)acryloyloxy group and containing not less than 20% by weight of bromine;

(c) 10 to 55% by weight of a monomer having two or more (meth)acryloyloxy groups in the molecule, exclusive of components (a) and (b);

(d) 5 to 50% by weight of a monomer having one (meth)acryloyloxy group in the molecule, exclusive of components (a) and (b);

(e) 2 to 35% by weight of at least and (f) 0.05 to 20% by weight of at least one photopolymerization catalyst selected from the group consisting of photo-initiators and photosensitizers, wherein the content of bromine in the total composition is in the range of 0.5 to 28% by weight.

As used herein, the terms "(meth)acrylate", "(meth)acryloyloxy" and "(meth)acrylic acid" mean methacrylate and/or acrylate, methacryloyloxy and/or acryloyloxy, and methacrylic acid and/or acrylic acid, respectively.

DETAILED DESCRIPTION OF THE PREFERRED EMBODIMENTS

The flame-retardant liquid photosensitive resin composition of the present invention contains 10 to 55% by weight of a (meth)acrylate (a) obtained by the reaction of a compound having two or more epoxy groups in the molecule with (meth)acrylic acid and a dibasic acid (inclusive of its anhydride) and having an acid value of 4 to 150 and a number average molecular weight of 300 to 5,000, which will hereinafter be referred to as a carboxyl-modified epoxy (meth)acrylate. The term "carboxyl-modified epoxy (meth)acrylate" as used herein denotes compounds obtained by the addition of (meth)acrylic acid to the epoxy groups present in a multifunctional epoxy compound or epoxy resin selected, for example, from bisphenol A-epichlorohydrin resins, epoxy-novolak resins, alicyclic epoxy resins, aliphatic epoxy resins, heterocylic epoxy resins, glycidyl ester type resins and other resins as described in "Engineering Plastics" (published by Kagaku Kogyo Nipposha on Mar. 15, 1983), followed by the addition of a dibasic acid anhydride (such as maleic anhydride or succinic anhydride) to the remaining hydroxyl groups; or compounds obtained by the reaction of a multifunctional epoxy compound or epoxy resin with (meth)acrylic acid and a dibasic acid, and thus characterized by containing carboxyl groups in the molecule. Specific examples of such compounds include a compound obtained by the reaction of a bisphenol A-epichlorohydrin epoxy resin with acrylic acid and the subsequent addition of maleic anhydride (molar ratio of epoxy group/acrylic acid/maleic anhydride=1/1/0.1) and a compound obtained by the reaction of a phenolic novolak epoxy resin with acrylic acid, methacrylic acid and succinic acid (molar ratio of epoxy group/acrylic acid/methacrylic acid/succinic acid=1/0.7/0.1/0.2).

In the carboxyl-modified epoxy (meth)acrylate (a), all molecules need not have carboxyl groups, but some molecules having no carboxyl group may remain. Accordingly, there may be used a compound synthesized under such conditions as to leave some molecules unmodified with carboxyl groups, or a mixture of a carboxyl-modified compound and an unmodified compound.

The carboxyl-modified epoxy (meth)acrylate (a) should have an average acid value of 4 to 150. If the average acid value is less than 4, the resulting composition will have such poor washability with alkali that, after curing, the uncured portions of the composition cannot be thoroughly washed off. On the other hand, if the average acid value is greater than 150, the cured coating film will be so hygroscopic that it cannot retain good electrical insulating properties under high-humidity conditions. From the viewpoint of electrical insulating properties, the preferred range of the average acid value is from 5 to 100.

Moreover, the carboxyl-modified epoxy (meth)acrylate (a) should have a number average molecular weight of 300 to 5,000, preferably 400 to 3,000. If the number average molecular weight is greater than 5,000, the resulting composition will have unduly high viscosity and, therefore, exhibit poor alkali developability and poor miscibility with other monomers and oligomers.

The carboxyl-modified epoxy (meth)acrylate (a) should be used in an amount 10 to 55% by weight, preferably 15 to 50% by weight, based on the total amount of the composition. If its amount used is less than 10% by weight, the resulting composition will have low resolution and give a cured coating film having poor adhesion to metallic surfaces. On the other hand, if it is greater than 55% by weight, the resulting composition will show a reduction in electrical insulating properties under high-humidity conditions.

Conventionally, the addition of a linear polymer containing carboxyl groups has been widely used as a means for imparting full alkali developability to a photosensitive resin composition of the full alkali developing type. However, the addition of a carboxyl-containing linear polymer to a liquid photosensitive resin composition for use as a solder resist would pose the following two serious problems One is that, since such a linear polymer cannot form a cross-linked structure, the cured coating film will show a decrease in solvent resistance. The other is that a special reactive diluent capable of dissolving this carboxyl-containing linear polymer must be used to prepare the photosensitive resin composition in the form of a homogeneous solution, and this reactive diluent tends to reduce the electrical insulating properties of the composition.

In the present invention, these problems have been solved by using a specific carboxyl-modified epoxy (meth)acrylate (a) in place of the aforesaid linear polymer. Specifically, when the resulting composition is cured by active radiation, the carboxyl-modified epoxy (meth)acrylate (a) is incorporated in the cross-linked structure and, therefore, can impart excellent solvent resistance to the cured coating film. Moreover, the carboxyl-modified epoxy (meth)acrylate (a) has a lower molecular weight than the aforesaid linear polymer and can be readily mixed with cross-linking monomers usually used in combination. This allows greater latitude in monomer composition and makes it possible to achieve excellent properties such as electrical insulating properties.

The flame-retardant liquid photosensitive resin composition of the present invention also contains 3 to 35% by weight of a monomer (b) having at last one (meth)acryloyloxy group and containing not less than 20% by weight of bromine in the molecule (hereinafter abbreviated as the bromine-containing (meth)acrylate (b)). Specific examples of the bromine-containing (meth)acrylate (b) include 2,4,6-tribromophenyl (meth)acrylate, 2,4,6-tribromophenoxyethyl (meth)acrylate, 2,4,6-tribromophenoxydiethoxy (meth)acrylate, 2,4,6-tribromophenoxytriethoxy (meth)acrylate, tetrabromobisphenol A mono(meth)acrylate, tetrabromobisphenol A di(meth)acrylate, tetrabromobiphenol A diethoxy mono(meth)acrylate, tetrabromobisphenol A diethoxy di(meth)acrylate, tetrabromobipshenol A bis(tetraethoxy(meth)acrylate), 2,4,6-tribromophenoxytetraethoxy (meth)acrylate and 3-(2,4,6-tribromophenoxy)-2-hydroxypropyl (meth)acrylate.

In order to keep the composition homogeneous during storage at low temperatures and yield a cured coating film having good thermal resistance under severe conditions, it is preferable to use a compound of the general formula

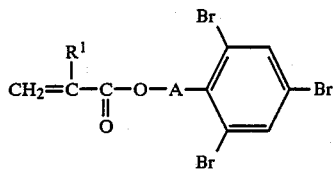

where $R^1$ is a hydrogen atom or a methyl group, and A is

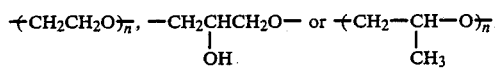

in which n is a whole number of 1 to 3.

The bromine-containing (meth)acrylate (b) containing not less than 20% by weight of bromine in the molecule should be used in an amount of 3 to 35% by weight based on the total amount of the composition, and the content of bromine in the total composition should be in the range of 0.5 to 28% by weight and preferably 1 to 20% by weight. If the amount of bromine compound (b) used is less than 3% by weight or the bromine content is 0.5% by weight, the resulting composition will not have a sufficient degree of flame retardancy. On the other hand, if the amount of bromine compound (b) is greater than 35% by weight or the bromine content is greater than 28% by weight, the cured coating film will show a reduction in adhesion and thermal resistance.

Use of the bromine-containing (meth)acrylate (b) containing not less than 20% by weight of bromine makes it possible to produce a flame-retardant liquid photosensitive resin composition having excellent homogeneity and alkali developability, yielding a cured coating film having good adhesion, solvent resistance, thermal resistance and electrical insulating properties, and exhibiting excellent flame retardancy.

If a different bromine compound, such as decabromobiphenyl ether that is known to be a flame retarder for plastics, is used in combination with the other components of the present invention and the resulting composition is applied to a copper surface, a slight amount of decabromobiphenyl ether will be adsorbed to and remain on the copper surface even after it has been sprayed and washed with a 1% aqueous solution of sodium carbonate. If tetrabromobisphenol A is used in combination with the other components of the present invention, the cured coating film may peel off when soaked in molten solder at 260° C. This seems to be due to the unreacted tetrabromobisphenol A which remains in the cured coating film and, when heated at 260° C., migrates to the copper surface to reduce the adhesion thereof.

The reason why the combination of the carboxyl-modified (meth)acrylate (a) and the bromine-containing (meth)acrylate (b) brings about the above-described excellent performance has not been understood fully. However, it is believed that the bromine-containing (meth)acrylate (b) is uniformly dissolved in the liquid composition prior to curing, and curing by ultraviolet radiation causes the bromine-containing (meth)acrylate (b), together with carboxyl-modified epoxy (meth)acrylate (a), to be incorporated in the cross-linked network, thus producing a more powerful flame-retarding effect without exerting any adverse influence on the properties of the cured coating film.

The flame-retardant liquid photosensitive resin composition of the present invention also contains 10 to 55% by weight of a monomer (c) having two or more (meth)acryloyloxy groups in the molecule (hereinafter referred to as a cross-linking monomer), exclusive of the compounds used as components (a) and (b). This cross-linking monomer (c) is used to improve the properties required for use as a solder resist, such as the curing rate of the composition and the scratch resistance, solvent resistance and electrical insulating properties of the cured coating film.

Specific examples of the cross-linking monomer (c) include 1,4-butanediol di(meth)acrylate, 1,6-hexamethylene glycol di(meth)acrylate, neopentyl glycol di(meth)acrylate, trimethylolpropane tri(meth)acrylate, pentaerythritol tri(meth)acrylate, pentaerythritol tetra(meth)acrylate, dipentaerythritol hexa(meth)acrylate, triethylene glycol di(meth)acrylate, urethane acrylates (such as Viscoat #812, #813, #823 and #851, manufactured by Osaka Organic Chemical Industry Co., Ltd.) and urethane methacrylates. These compounds may be used alone or in admixture of two or more.

This cross-linking monomer (c) should be used in an amount of 10 to 55% by weight, preferably 10 to 50% by weight, based on the total amount of the composition. If its amount used is less than 10% by weight, the resulting composition will have poor solvent resistance and show a reduction in electrical insulating properties under high-humidity conditions. On the other hand, if its amount used is greater than 55% by weight, the resulting composition will have poor alkali developability and poor adhesion to metallic surfaces.

Moreover, 50% by weight or more, particularly 60% by weight or more of the cross-linking monomer (c) should preferably comprise a monomer containing ester linkages not associated with acrylate and/or methacryalte and having a number average molecular weight of 200 to 800 and a number average molecular weight per polymerizable double bond of 100 to 250.

By having a moderate molecular weight and a moderate molecular weight per double bond, the aforesaid cross-linking monomer containing ester linkages can impart an adequate cross-linking density to the cured coating film and thereby improve the solvent resistance and adhesion of the cured coating film at the same time. Moreover, by containing ester linkages not associated with (meth)acrylate in the molecule, the aforesaid cross-linking monomer can improve especially the adhesion and thermal resistance of the cured coating film and thus enables the resulting composition to retain high electrical insulating properties under high-humidity conditions. Specific examples of the above-defined compound include neopentyl glycol hydroxypivalate diacrylate [molecular weight=312; molecular weight per polymerizable double bond=156], neopentyl glycol hydroxypivalate dimethacrylate [molecular weight=340; molecular weight per polymerizable double bond=170], a co-condensation product of succinic acid/trimethylolethane/acrylic acid (molar ratio=1/2/4) average molecular weight=600; molecular weight per polymerizable double bond=150], a co-condensation product of adipic acid/trimethylolpropane/acrylic acid (molar ratio=1/2/4) [average- molecular weight=680; molecular weight per polymerizable double bond=170], and various oligoester (meth)acrylates manufactured by Toagosei Chemical Industry Co., Ltd., such as Aronix M-6100 [average molecular weight=450; molecular weight per polymerizable double bond=225), Aronix M-6250 [average molecular weight=450; molecular weight per polymerizable double bond=225], Aronix M-6500 [average molecular weight=446; molecular weight per polymerizable double bond=223], Aronix M-7100 [average molecular weight=565; molecular weight per polymerizable double bond=188], Aronix M-8030 average molecular weight=393, molecular weight per polymerizable double bond=119], Aronix M-8060 average molecular weight=489; molecular weight per polymerizable double bond=136], Aronix M-8100 average molecular weight=618; molecular weight per polymerizable double bond=155] and Aronix M-6300 average molecular weight=478; molecular weight per polymerizable double bond=239].

The flame-retardant liquid photosensitive resin composition of the present invention also contains 5 to 50% by weight of a monomer (d) having one (meth)acryloyloxy group in the molecule (hereinafter referred to as a monofunctional (methacrylate), exclusive of the compounds used as components (a) and (b). This monofunctional (meth)acrylate (d) not only dilutes the aforesaid carboxyl-modified epoxy (meth)acrylate (a) to reduce the viscosity of the composition, but also takes part in its cure by active radiation to impart flexibility to the cured coating film and thereby improve the adhesion of the coating film to the substrate.

Specific examples of the monofunctional (meth)acrylate (d) include acrylates and methacrylates such as tetrahydrofurfuryl (meth)acrylate, ethoxyethoxyethyl (meth)acrylate, 2-methoxyethyl (meth)acryalte, benzyl (meth)acrylate, cyclohexyl (meth)acryalte, dicyclopentadienyloxyethyl (meth)acrylate, methyltriethylene glcyol (meth)acrylate and lauryl (meth)acrylate.

The monofunctional (meth)acryalte (d) should be used in an amount of 5 to 50% by weight, preferably 10 to 50% by weight, based on the total amount of the composition. If its amount used is less than 5% by weight, the adhesion of the cured coating film will be reduced, while if it is greater than 50% by weight, its solvent resistance will be decreased.

Moreover, in view of the performance requirements of a liquid photosensitive resin composition for use as a solder resist, including good adhesion to metallic surfaces, high hardness, good adhesion at high temperatures, high solvent resistance, good electrical insulating properties under high-humidity conditions, little odor development and little irritation to the skin, 50% by weight or more of the bromine-containing (meth)acrylate (b) should preferably comprise a compound of the general formula

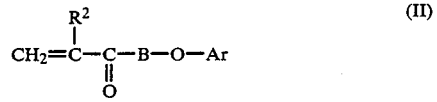
(II)

where $R^2$ is a hydrogen atom or a methyl group, B is

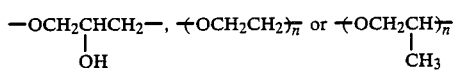

in which n is a whole number of 1 to 3, and Ar is a phenyl group which may have an alkyl group of not more than 12 carbon atoms.

The compounds within the scope of the general formula (II) are characterized by the fact that the presence of a phenoxy group raises their boiling points (resulting in little odor development and little irritation to the skin) and their appropriate degree of polarity improves the adhesion of the cured coating film to metallic surfaces (at ordinary and elevated temperatures) without reducing its electrical insulating properties under high-humidity conditions. Moreover, these compounds have relatively short side chains in spite of their high molecular weights and, therefore, do not decrease the solvent resistance or hardness of the cured coating film.

Specific examples of the compounds represented by the general formula (II) include phenoxyethyl (meth)acrylate, phenoxyethyloxyethyl (meth)acrylate, phenoxytetraethylene glycol (meth)acryalte, p-nonylphenoxyethyl (meth)acrylate and 3-phenoxy-2-hydroxypropyl (meth)acrylate.

The flame-retardant liquid photosensitive resin composition of the present invention also contains 2 to 35% by weight of at least one inorganic filler (e). Usable inorganic fillers include extender pigments, antimony compounds as auxiliary flame retarders, silica materials as thickeners, and the like.

Extender pigments may be used not only to improve the strength of the cured coating film, but also to moderate its polymerization shrinkage and thereby improve its adhesion to the substrate. Specific examples of usable extender pigments include calcium carbonate, talc and mica. Among others, plate-like particles of talc or mica or needle-like particles of talc are highly effective in improving the adhesion of the coating film. These extender pigments may be used without any treatment or in a form surface-treated or surface-coated with an inorganic material and/or an organic material.

In view of the strength, adhesion and resolution of the coating film, such an extender pigment should be used in an amount of 2 to 35% by weight, preferably 5 to 30% by weight, based on the total amount of the composition.

Antimony compounds may be used as a part of the inorganic filler (e). Antimony compounds can impart a higher degree of flame retardancy to the composition and, moreover, can reduce the amount of bromine compound (b) used. Specific examples of usable antimony compounds include antimony trioxide and antimony pentoxide (tetrahydrate). From the viewpoint of uniform dispersibility in the composition and transmissivity to ultraviolet radiation at wavelengths of 300 to 400 nm, it is preferable to use an antimony compound having an average particle diameter of not greater than 0.1 $\mu$m. Such an antimony compound should preferably be used in an amount of 0.2 to 4% by weight based on the total amount of the composition.

In order to improve the viscosity, thixotropy and coating properties of the composition, thickeners such as amorphous silica may be used as a part of the inorganic filler (e). As the amorphous silica, there may be used various commercial products including Aerosil (manufactured by Nippon Aerosil K.K.), Cab-O-Sil (manufactured by Cabot Inc.), Syloid (manufactured by Fuji-Devison Co., Ltd.) and Nipsil (manufactured by Nippon Silica Industrial Co., Ltd.). In addition, silica products having hydrophilic surfaces and silica products surface-treated to be hydrophobic (such as Nipsil SS-50X and Cab-O-Sil T720) may also be used. Such a thickener should be used in an amount of 0 to 25% by weight based on the total amount of the composition.

The inorganic filler (e) should be used in an amount of 2 to 35% by weight, preferably 3 to 35% by weight, based on the total amount of the composition. If its amount used is less than 2% by weight, the resulting composition will have poor coating properties and poor adhesion at elevated temperatures. If it is greater than 35% by weight, the resulting composition will have shortcomings from the viewpoint of electrical insulating properties and developability.

The flame-retardant liquid photosensitive resin composition of the present invention also contains 0.05 to 20% by weight of at least one photopolymerization catalyst (f) selected from the group consisting of photoinitiators and photosensitizers. The photopolymerization catalyst can be any compound that produces a radical on exposure to active radiation such as ultraviolet or visible radiation and thereby initiates the polymerization reaction. Specific examples of usable photopolymerization catalysts include 2-ethylanthraquinone, 1,4-naphthoquinone, benzoin ethyl ether, benzoin propyl ether, benzophenone, 4,4'-bis(dialkylamino)benzophenones, benzyl dimethyl ketal, 4'-isopropyl-2-hydroxy-2-methylpropiophenone, 2-hydroxy-2-methylpropiophenone and 2-methyl-(4-methylthio)phenyl-2-morpholino-1-propane. These photopotopolymerization catalysts may be used alone or in admixture of two or more.

From the viewpoint of the curing rate of the composition and properties of the cured coating film, the photopolymerization catalyst should be used in an amount of 0.05 to 20% by weight, preferably 0.1 to 10% by weight, based on the total amount of the composition.

In addition to components (a) to (f), the flame-retardant liquid photosensitive resin composition of the present invention may further contain various conventional additives such as thermal polymerization inhibitors, colorants (i.e., pigments and dyes) and antifoaming agents, according to the intended purpose.

Thermal polymerization inhibitors may be used in order to prevent the photosensitive resin composition from being thermally cured prior to photocuring. Specific examples of usable thermal polymerization inhibitors include p-methoxyphenol, hydroquinone, p-benzoquinone, tert-butylcatecol, pyrogallol, naphthylamine and phenothiazine. In view of their influence on photocurability and other factors, thermal polymerization inhibitors should preferably be used in an amount of not greater than 3% by weight, more preferably not greater than 1% by weight, based on the total amount of the composition.

For example, if it is desired to give a green color to the composition, usable pigments include chlorinated phthalocyanine green (P. Gr. 7) and chlorobrominated phthalocyanine green (P. Gr. 36), and usable dyes include Sumiplast Green G (manufactured by Sumitomo Chemical Industries Co., Ltd.).

Usable antifoaming agents include various antifoaming agents such as silicone type and non-silicone type ones.

The liquid photosensitive resin composition of the present invention may have any viscosity that renders the composition substantially flowable at ordinary temperatures. However, from the viewpoint of handling properties (in particular, coating properties), the composition should have a viscosity of 1,000 to 100,000 cps, more preferably 2,000 to 80,000 cps, as measured at 25° C. with a Brookfield type viscometer.

The liquid photosensitive resin composition of the present invention may be used according to any of various well-known methods. It is most common to form a cured coating film according to a method involving the steps of application, exposure and alkali development.

The method of application can be any of various well-known methods. For example, there may be employed the "direct application method" in which the liquid photosensitive resin composition is directly applied to a printed circuit board with an applicator (such as a Baker type applicator or a bar coater) or through a silk screen; the "indirect application method" in which the liquid photosensitive resin composition is applied to the surface of a transparent film or sheet or an artwork, and the latter is placed on a printed circuit board in such a way that the liquid photosensitive resin composition layer comes into contact with the printed circuit board; and the "double-side application method" in which the liquid photosensitive resin composition is applied to the surface of a printed circuit board and the surface of a transparent film or sheet or an artwork, which are laid on top of each other in such a way that the liquid photosensitive resin composition layers come into contact with each other.

The method of exposure can be any of various well-known methods. For example, this can be accomplished by irradiating the liquid photosensitive resin composition layer with active radiation (such as visible or ultraviolet radiation) through a photomask. In this case, the liquid photosensitive resin composition layer may be in direct contact with the photomask or in indirect contact with the photomask through a transparent film, sheet or the like. Alternatively, the liquid photosensitive resin composition layer may be separated from the photomask by a thin layer of gas.

Development can be carried out according to any of various well-known developing methods for photosensitive resin compositions of the alkali developing type.

Furthermore, in order to obtain a more completely cured coating film, the alkali development may be followed by after-treatment with active radiation and/or heat.

The liquid photosensitive resin composition of the present invention is not only useful as a solder resist, but also suitable for use in a wide variety of applications such as letterpress printing and the like.

The present invention is further illustrated by the following examples.

EXAMPLE 1

A liquid photosensitive resin composition (with a bromine content of 3.2%) was prepared by mixing the following ingredients and kneading the mixture on a three-roll mill:

| | |
|---|---|
| Reaction product of bisphenol A diglycidyl ether/acrylic acid/maleic anhydride (molar ratio of epoxy group/acrylic acid/maleic anhydride = 1/1/0.25; average molecular weight = 400; acid value = 50) | 30 g |
| Tetrabromibisphenol A diethoxy diacrylate (bromine content = 43.2%) | 7.5 g |
| Neopentyl glycol diacrylate | 20.9 g |
| Dicyclopentadienyl oxyethylacrylate | 15 g |
| Talc (Talc SK, manufactured by Tsuchiya Kaolin Co., Ltd.) | 15 g |
| Antimony trioxide (average particle diameter = 0.02 μm) | 0.4 g |
| Silica (Nipsil SS 50X, manufactured by | 8 g |

-continued

| Nippon Silica Industrial Co., Ltd.) | |
|---|---|
| Benzyl dimethyl ketal | 1 g |
| Chlorinated copper phthalocyanine | 0.1 g |
| p-Methoxyphenol | 0.1 g |
| Antifoaming agent (Silicone Oil SH-200, manufactured by Toray Silicone Co., Ltd.) | 2 g |

EXAMPLE 2

A liquid photosensitive resin composition (with a bromine content of 4.2%) was prepared by mixing the same ingredients as used in Example 1, except that the tetrabromobisphenol A diethoxy diacrylate was replaced by the same amount of 2,4,6-tribromophenoxy ethyl acrylate, and kneading the mixture on a three-roll mill.

EXAMPLES 3–10 AND COMPARATIVE EXAMPLES 1–5

Various compositions were prepared by mixing the following ingredients and kneading the mixture on a three-roll mill:

| | |
|---|---|
| Reaction product of bisphenol A diglycidyl ether/acrylic acid/maleic anhydride (molar ratio of epoxy group/ acrylic acid/maleic anhydride = 1/1/0.25; average molecular weight = 400; acid value = 50) | a g |
| Bromine compound | b g |
| Neopentyl glycol hydroxypivalate diacrylate | c g |
| Phenoxyethyl acrylate | d g |
| Talc (Talc SK, manufactured by Tuchiya Kaolin Co., Ltd.) | e' g |
| Antimony trioxide (average particle diameter = 0.02 μm) | e'' g |
| Silica (Aerosil #200, manufactured by Nippon Aerosil K. K.) | e''' g |
| Benzyl dimethyl ketal | 1 g |
| Chlorinated copper phthalocyanine | 0.1 g |
| p-Methoxyphenol | 0.1 g |
| Antifoaming agent (Colloid #640, manufactured by Americal Colloid Inc.) | 2 g |

The values for a to e''' are given in Table 1 below.

EXAMPLE 11

A liquid photosensitive resin composition (with a bromine content of 4.1%) was prepared by mixing the following ingredients and kneading the mixture on a three-roll mill:

| | |
|---|---|
| Reaction product of bisphenol A diglycidyl ether/acrylic acid/maleic anhydride (molar ratio of epoxy group/acrylic acid/ maleic anhydride = 1/1/0.13; average molecular weight = 400; acid value = 25) | 16 g |
| 2,4,6-Tribromophenoxyethyl methacrylate (bromine content = 54.1%) | 7.5 g |
| Co-condensation product of succinic acid/trimethylolethane/acrylic acid (molar ratio = 1/2/4) (average molecular weight = 680; molecular weight per polymerizable double bond = 150) | 15 g |
| 3-Phenoxy-2-hydroxypropyl acrylate | 39.2 g |
| Talc | 12 g |
| Antimony pentoxide tetrahydrate | 3 g |
| Silica | 4 g |
| Benzyl dimethyl ketal | 1 g |
| Chlorobrominated copper phthalocyanine | 0.2 g |
| p-Methoxyphenol | 0.1 g |
| Antifoaming agent | 2 g |

In this and the following examples, the talc comprised Talc SK, manufactured by Tsuchiya Kaolin Co., Ltd.; the silica comprised Aerosil #200, manufactured by Nippon Aerosil K.K.; and the antifoaming agent comprised Colloid #640, manufactured by Colloid International Inc.

EXAMPLE 12

A liquid photosensitive resin composition (with a bromine content of 3.8%) was prepared by mixing the following ingredients and kneading the mixture on a three-roll mill:

| | |
|---|---|
| Reaction product of bisphenol A diglycidyl ether/acrylic acid/maleic anhydride (molar ratio of epoxy group/acrylic acid/ maleic anhydride = 1/1/0.4; average molecular weight = 500; acid value = 80) | 48 g |
| 2,4,6-Tribromophenoxydiethoxy acrylate (bromine content = 50.7%) | 7.5 g |
| Neopentyl glycol hydroxypivalate diacrylate | 11.9 g |
| Phenoxydiethoxy acrylate | 10 g |
| Talc | 15 g |
| Antimony trioxide (average particle diameter = 0.02 μm) | 0.4 g |
| Silica | 4 g |
| Benzyl dimethyl ketal | 1 g |
| Chlorinated copper phthalicyanine | 0.1 g |
| p-Methoxyphenol | 0.1 g |

TABLE 1

| | Example | | | | | | | | Comparative Example | | | | |
|---|---|---|---|---|---|---|---|---|---|---|---|---|---|
| Example No. | 3 | 4 | 5 | 6 | 7 | 8 | 9 | 10 | 1 | 2 | 3 | 4 | 5 |
| a | 32 | 32 | 32 | 30 | 25 | 32 | 32 | 32 | 32 | 32 | 20 | 32 | 32 |
| Type of bromine compound | (1) | (1) | (1) | (1) | (1) | (2) | (3) | (4) | — | (1) | (1) | (5) | (6) |
| b | 7.5 | 7.5 | 3 | 25 | 3 | 7.5 | 7.5 | 7.5 | 0 | 1.5 | 40 | 7.5 | 7.5 |
| c | 22.9 | 22.9 | 22.9 | 12.4 | 16 | 22.9 | 22.9 | 22.9 | 22.9 | 22.9 | 12.4 | 22.9 | 22.9 |
| d | 15 | 15 | 19.5 | 11.2 | 23.6 | 15 | 15 | 15 | 22.5 | 21 | 11.2 | 15 | 15 |
| e' | 15 | 15.4 | 15 | 13.8 | 28 | 15 | 15 | 15 | 15 | 15 | 8.8 | 15 | 15 |
| e'' | 0.4 | 0 | 0.4 | 0.4 | 0.2 | 0.4 | 0.4 | 0.4 | 0.4 | 0.4 | 0.4 | 0.4 | 0.4 |
| e''' | 4 | 4 | 4 | 4 | 1 | 4 | 4 | 4 | 4 | 4 | 4 | 4 | 4 |
| Bromine content of composition (%) | 4.2 | 4.2 | 1.7 | 14.0 | 1.7 | 3.5 | 4.7 | 3.2 | 0 | 0.8 | 22.4 | 6.3 | 4.2 |

(1) 2,4,6-Tribromophenoxyethyl acrylate (bromine content = 55.9%)
(2) 2,4,6-Tribromophenoxytriethoxy acrylate (bromine content = 46.4%)
(3) 2,4,6-Tribromophenyl acrylate (bromine content = 62.3%)
(4) 2,4,6-Tribromophenoxytetraethoxy acrylate (bromine content = 42.8%)
(5) Decabromobiphenyl ether (bromine content = 83.3%)
(6) Tetrabromobisphenol A (bromine content = 58.8%)

-continued

| | |
|---|---|
| Antifoaming agent | 2 g |

EXAMPLE 13

A liquid photosensitive resin composition (with a bromine content of 3.5%) was prepared by mixing the following ingredients and kneading the mixture on a three-roll mill:

| | |
|---|---|
| Reaction product of phenolic novolak type epoxy resin/acrylic acid/succinic anhydride (molar ratio of epoxy group/acrylic acid/succinic anhydride = 1/1/0.3; average molecular weight = 1,100; acid value = 74) | 32 g |
| 2,4,6-Tribromophenoxytriethoxy acrylate (bromine content = 46.4%) | 7.5 g |
| Aronix M-6100 (average molecular weight = 450; molecular weight per polymerizable double bond = 125) | 44.9 g |
| Phenoxyethyl acrylate | 6 g |
| Talc | 5 g |
| Antimony trioxide (average particle diameter = 0.02 μm) | 0.4 g |
| Silica | 1 g |
| Benzyl dimethyl ketal | 1 g |
| Chlorinated copper phthalocyanine | 0.1 g |
| p-Methoxyphenol | 0.1 g |
| Antifoaming agent | 2 g |

EXAMPLE 14

A liquid photosensitive resin composition (with a bromine content of 3.9%) was prepared by mixing the following ingredients and kneading the mixture on a three-roll mill:

| | |
|---|---|
| Reaction product of bisphenol A diglycidyl ether/acrylic acid/maleic anhydride (molar ratio of epoxy group/acrylic acid/maleic anhydride = 1/1/0.5; average molecular weight = 500; acid value = 110) | 20 g |
| 3-(2,4,6-Tribromophenoxy)-2-hydroxypropyl acrylate (bromine content = 52.3%) | 7.5 g |
| Neopentyl glycol hydroxypivalate diacrylate | 30.9 g |
| Phenoxyethyl acrylate | 20 g |
| Talc | 15 g |
| Antimony trioxide (average particle diameter = 0.02 μm) | 0.4 g |
| Silica | 4 g |
| Benzyl dimethyl ketal | 1 g |
| Sumiplast Green G (manufactured by Sumitomo Chemical Industries Co., Ltd.) | 0.1 g |
| p-Methoxyphenol | 0.1 g |
| Antifoaming agent | 1 g |

The performance of the compositions obtained in the foregoing examples and comparative examples was evaluated according to the following procedures. The results thus obtained are shown in Table 2.

(1) Preparation of a coating ready for curing

A copper-clad laminate (ELC4708, manufactured by Sumitomo Bakelite Co., Ltd.) was cut into 10 cm×15 cm pieces, which were pretreated by abrasion, washing and dewatering. Using a Baker type applicator, the pretreated pieces of copper-clad laminate were each coated with a liquid photosensitive resin composition prepared under various conditions to a thickness of 100 μm. Each of the coating films so formed was then covered with a polyester film 25 μm thick to obtain a coating ready for curing. (The term "coating ready for curing" as used wherein means a coating film formed as described above and then covered with a polyester film.)

(2) Determination of optimum primary exposure conditions and evaluation of developability (2-1) Primary exposure On a coating ready for curing were placed a negative film 120 μm thick (STOUFFER Resolution Guide #1-T, manufactured by Stouffer Graphic Arts Equipment Co.) and then a Pyrex ® glass plate 3 mm thick. Then, the coating was exposed to radiation from a 100 W high pressure mercury lamp (UH-100, manufactured by Ushio Inc.) located 15 cm above the coating. The exposure time was varied from 10 to 180 seconds. The magnitude of the exposure energy was measured by means of a UVR-365 tester (manufactured by Tokyo Optical Co., Ltd.).

(2-2) Development

The 25 μm thick polyester film was stripped from the coating film after undergoing the primary exposure. Then, the coating film was subjected to spray development under the following conditions:

| | |
|---|---|
| Developer: | 1% aqueous solution of sodium carbonate (40° C.). |
| Nozzle: | JUP-03 [manufacture by H, Ikeuchi & Co., Ltd.] (1.5 Kg/cm$^2$, 2.6 liters/min.). |
| Distance from nozzle: | 15 cm. |
| Time: | 30 seconds. |

Thereafter, the coating film was washed with running water, dewatered by a stream of air, and then dried at 70° c. for 5 minutes.

(2-3) Postcuring

After completion of the development, the coating film was photocured and heat-treated under the following conditions, and then allowed to cool to room temperature:

(A) Photocuring

| | |
|---|---|
| Light source: | 5 kW high pressure mercury vapor lamp (H-500 UVA, manufactured by Mitsubishi Electric Corp.). |
| Distance: | 20 cm. |
| Speed of passage: | 0.9 m/min. |

(B)

Heat treatment (after postcuring),

Heat-treating conditions: 160° C. 10 min.

(2-4) Determination of optimum primary exposure energy

By comparing the coating films obtained at varying primary exposure times, the exposure energy (in mJ/cm$^2$) required to obtain a coating film reproducing the patterns of the aforesaid Resolution Guide most exactly was determined.

(2-5) Evaluation of developability

The developability of the composition was evaluated by observing the surface of the sample developed at the optimum primary exposure energy under a microscope (30× magnification).

| | |
|---|---|
| ⊙ . . . | No residual resinous material was present in the unexposed areas. |
| X . . . | Residual resinous material was present in |

-continued the unexposed areas.

(3) Evaluation of properties of a cured coating film
(3-1) Primary exposure
On a coating ready for curing were placed a polyester film 120 μm thick and then a Pyrex ® glass plate 3 mm thick. Then, the coating was exposed to radiation from a 100W high pressure mercury vapor lamp (UH-100, manufactured by Ushio Inc.) located 15 cm above the coating, for a period of time corresponding to the optimum primary exposure energy.
(3-2) Development
The coating film was developed in the same manner as described in (2-2).
(3-3) Postcuring
The coating film was postcured in the same manner as described in (2-3).
(3-4) Evaluation of thermal resistance
The postcured coating film, together with the substrate, was soaked in molten solder at 260° C. for either 10 or 20 seconds. After removal, the state of the coating film was examined and evaluated.

| ⊙ ... | No change was observed after soaking for 20 seconds. |
| ○ ... | No change was observed after soaking for 10 seconds, but blistering, peeling and/or cracking were noted after soaking for 20 seconds. |
| X ... | Blistering, peeling and/or cracking are noted after soaking for 10 seconds. |

(3-5) Evaluation of adhesion
The adhesion of the postcured coating film was evaluated according to the first method for crosscut adhesion testing described in JIS-D-0202. (Crosscuts were made at intervals of 2 mm.)

| ⊙ ... | The area of the lost portions was less than 5% of the total square area. |
| ○ ... | The area of the lost portions was less than 10% of the total square area. |
| X ... | The area of the lost portions was not less than 10% of the total square area. |

(3-6) Evaluation of solvent resistance
The postcured coating film, together with the substrate, was soaked in trichloroethane and dichloromethane at 25° C. for 10 minutes each. After removal, the state of the coating film was examined and evaluated.

| ⊙ ... | No change was observed after soaking in trichloroethane or after soaking in dichloromethane. |
| ○ ... | Blistering, peeling and/or dissolution were noted after soaking in trichloroethane or after soaking in dichloromethane. |
| X ... | Blistering, peeling and/or dissolution were noted both after soaking in trichloroethane and after soaking in dichloromethane. |

(3-7) Measurement of volume resistivity (evaluation electrical insulating properties)
The postcured coating film was kept for 100 hours in an environment having a temperature of 50° C. and a relative humidity of 90%. Thereafter, using a Model SM-10E Ultrahigh Insulation Resistance Tester (manufactured by Toa Electronics Ltd.), the volume resistivity of the coating film was measured after a voltage of 500 V was applied for 1 minute.
(4) Evaluation of flame retardancy
Using a copper-clad glass-epoxy laminate (Sumilite ELC-4756, manufactured by Sumitomo Bakelite Co., Ltd.) having a thickness of 1.6 mm, the copper layers were removed from both sides thereof by etching with an aqueous solution of ferric chloride. On both sides of the etched substrate, a cured coating film 100 μm thick was formed according to the procedures described in (1), (3-1), (3-2) and (3-3). Then, ten test pieces measuring 127 mm × 12.7 mm were cut out of the coated substrate. Of these ten test pieces, five were allowed to stand at a temperature of 23° C. and a relative humidity of 50% for 48 hours or more, and the other five were heat-treated at 125° C. for 24 hours and then cooled in a desiccator containing anhydrous calcium chloride for 4 to 5 hours. These test pieces were tested for flame retardancy according to the "UL-94 V-0" method of Underwriters' Laboratories, Inc., and the maximum burning time (in seconds) and the average burning time (in seconds) were recorded.
(5) Homogeneity of the liquid composition
The resulting liquid photosensitive resin composition was stored in the dark at both 23° C. and 0° C. for 2 hours and then examined for homogeneity.

| ⊙ ... | No change was observed. |
| ○ ... | precipitate was formed, but the composition could be made homogeneous by remixing at 23° C. |
| X ... | A precipitate was formed, and the composition could no longer be made homogeneous by remixing at 23° C. |

TABLE 2

| Example No. | Example |||||||||||||| 
| | 1 | 2 | 3 | 4 | 5 | 6 | 7 | 8 | 9 | 10 | 11 | 12 | 13 | 14 |
| --- | --- | --- | --- | --- | --- | --- | --- | --- | --- | --- | --- | --- | --- | --- |
| Optimum primary exposure energy (mJ/cm$^2$) | 120 | 120 | 120 | 120 | 120 | 130 | 110 | 120 | 120 | 120 | 130 | 130 | 130 | 130 |
| Developability | ⊙ | ⊙ | ⊙ | ⊙ | ⊙ | ⊙ | ⊙ | ⊙ | ⊙ | ⊙ | ⊙ | ⊙ | ⊙ | ⊙ |
| Thermal resistance | ○ | ○ | ⊙ | ⊙ | ⊙ | ⊙ | ⊙ | ⊙ | ○ | ⊙ | ⊙ | ⊙ | ⊙ | ⊙ |
| Adhesion | ○ | ○ | ⊙ | ⊙ | ⊙ | ⊙ | ⊙ | ⊙ | ⊙ | ○ | ⊙ | ⊙ | ⊙ | ⊙ |
| Solvent resistance | ⊙ | ⊙ | ⊙ | ⊙ | ⊙ | ⊙ | ⊙ | ⊙ | ⊙ | ○ | ⊙ | ⊙ | ⊙ | ⊙ |
| Volume resistivity ($\Omega = 10^{13}$) | 4.2 | 3.9 | 2.8 | 2.8 | 2.9 | 2.6 | 1.8 | 2.9 | 3.3 | 2.7 | 3.1 | 2.0 | 1.9 | 1.8 |
| Flame retardancy Maximum burning time (sec.) | 7.0 | 6.9 | 3.8 | 5.9 | 5.0 | 3.8 | 4.8 | 4.1 | 8.7 | 7.2 | 4.1 | 4.3 | 4.8 | 4.2 |
| Average burning | 1.5 | 1.4 | 0.9 | 1.2 | 1.1 | 0.8 | 1.1 | 1.0 | 1.5 | 1.6 | 1.0 | 1.1 | 1.2 | 1.0 |

TABLE 2-continued

| | | | | | | | | | | | | | | |
|---|---|---|---|---|---|---|---|---|---|---|---|---|---|---|
| time (sec.) UL-94 grade | V0 | V0 | V0 | V0 | V0 | V0 | V0 | V0 | V0 | V0 | V0 | V0 | V0 | V0 |
| Homogeneity of liquid composition | ○ | ◉ | ◉ | ◉ | ◉ | ◉ | ◉ | ◉ | ◉ | ◉ | ◉ | ◉ | ○ | ◉ |

| | | Comparative Example | | | | |
|---|---|---|---|---|---|---|
| Example No. | | 1 | 2 | 3 | 4 | 5 |
| Optimum primary exposure energy (mJ/cm²) | | 120 | 120 | 120 | 120 | 120 |
| Developability | | ◉ | ◉ | ◉ | X | ◉ |
| Thermal resistance | | ◉ | ◉ | X | ○ | X |
| Adhesion | | ◉ | ◉ | ○ | ○ | ○ |
| Solvent resistance | | ◉ | ◉ | ○ | ○ | ◉ |
| Volume resistivity (Ω = 10¹³) | | 3.0 | 2.9 | 2.0 | 2.0 | 2.6 |
| Flame retardancy | Maximum burning time (sec.) | 25.1 | 18.1 | 3.9 | 11.1 | 10.1 |
| | Average burning time (sec.) | 4.3 | 4.0 | 0.8 | 3.6 | 4.6 |
| | UL-94 grade | V1 | V1 | V0 | V1 | V1 |
| Homogeneity of liquid composition | | ◉ | ◉ | ○ | ○ | ◉ |

What is claimed is:

1. A flame-retardant liquid photosensitive resin composition consisting essentially of
   (a) 10 to 55% by weight of a (meth)acrylate obtained by the reaction of a compound having two or more epoxy groups in the molecule with (meth)acrylic acid and a dibasic acid or its anhydride, the (meth)acrylate having an average acid value of 4 to 150 and a number average molecular weight of 300 to 5,000;
   (b) 3 to 35% by weight of a monomer having at least one (meth)acryloyloxy group and containing not less than 20% by weight of bromine;
   (c) 10 to 55% by weight of a monomer having two or more (meth)acryloyloxy groups in the molecule, exclusive of components (a) and (b);
   (d) 5 to 50% by weight of a monomer having one (meth)acryloyloxy group in the molecule, exclusive of components (a) and (b);
   (e) 2 to 35% by weight of at least one inorganic filler; and
   (f) 0.05 to 20% by weight of at least one photopolymerization catalyst selected from the group consisting of photo-initiators and photosensitizers,
wherein the content of bromine in the total composition is in the range of 0.5 to 28% by weight.

2. A flame-retardant liquid photosensitive resin composition as claimed in claim 1 wherein said monomer
   (b) having at least one (meth)acryloyloxy group and having not less than 20% by weight of bromine is a compound of the general formula

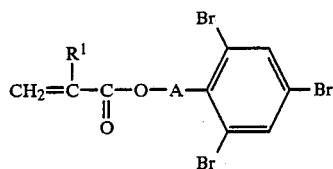

wherein R¹ is a hydrogen atom or a methyl group, and A is

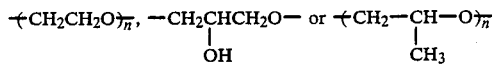

which n is a whole number of 1 to 3.

3. A flame-retardant liquid photosensitive resin composition as claimed in claim 1 wherein 50% by weight or more, especially 60% by weight or more, of said monomer (C) having two or more (meth)acryloyloxy groups in the molecule consists of a monomer containing ester linkages not associated with (meth)acrylte in the molecule and having a number average molecular weight of 200 to 800 and a number average molecular weight per polymerizable double bond of 100 to 250, and at least 50% by weight of said monomer (d) having one (meth)acryloyloxy group in the molecule consists of a compound of the general formula

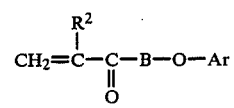

where R² is a hydrogen atom or a methyl group, B is

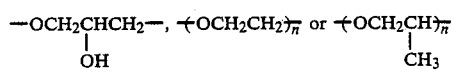

n is a whole number of 1 to 3, and Ar is a phenyl group which may have an alkyl group of not more than 12 carbon atoms.

4. A flame-retardant liquid photosensitive resin composition as claimed in claim 2 wherein 50% by weight or more, especially 60% by weight or more, of said monomer (c) having two or more (meth)acryloyloxy groups in the molecule consists of a monomer containing ester linkages not associated with (meth)acrylate in the molecule and having a number average molecular weight of 200 to 800 and a number average molecular weight per polymerizable double bond of 100 to 250, and 50% by weight or more of said monomer (d) having one (meth)acryloyloxy group in the molecule consists of a compound of the general formula $$CH_2=C(R^2)-C(=O)-B-O-Ar \qquad (II)$$

where $R^2$ is a hydrogen atom or a methyl group, B is $$-OCH_2CHCH_2-,\ -(OCH_2CH_2)_{\overline{n}}\ \text{or}\ -(OCH_2CH)_{\overline{n}}$$
$$\phantom{-OCH_2C}\overset{|}{OH}\phantom{CH_2-,\ -(OCH_2CH_2)_{\overline{n}}\ \text{or}\ -(OCH_2}\overset{|}{CH_3}$$

in which n is a whole number of 1 to 3, and Ar is a phenyl group is a whole number of which may have an alkyl group of not more than 12 carbon atoms.

5. A flame-retardant liquid photosensitive resin composition as claimed in claim 1 wherein, as a part of said inorganic filler (e), an antimony compound is used in an amount of 0.2 to 4% by weight based on the total amount of the composition.

6. A flame-retardant liquid photosensitive resin composition as claimed in claim 2 wherein, as a part of said inorganic filler (e), an antimony compound is used in an amount of 0.2 to 4% by weight based on the total amount of the composition.

7. A flame-retardant liquid photosensitive resin composition as claimed in claim 3 wherein, as a part of said inorganic filler (e), an antimony compound is used in an amount of 0.2 to 4% by weight based on the total amount of the composition.

8. A flame-retardant liquid photosensitive resin composition as claimed in claim 4 wherein, as a part of said inorganic filler (e), an antimony compound is used in an amount of 0.2 to 4% by weight based on the total amount of the composition.

* * * * *